(12) United States Patent
Emigh et al.

(10) Patent No.: US 8,473,083 B1
(45) Date of Patent: Jun. 25, 2013

(54) SYNTHESIZED AUDIO PARAMETERS

(76) Inventors: Aaron T. Emigh, Incline Village, NV (US); Derek W. Meyer, Truckee, CA (US)

( * ) Notice: Subject to any disclaimer, the term of this patent is extended or adjusted under 35 U.S.C. 154(b) by 403 days.

(21) Appl. No.: 12/839,376

(22) Filed: Jul. 19, 2010

Related U.S. Application Data

(60) Provisional application No. 61/226,744, filed on Jul. 19, 2009.

(51) Int. Cl.
*G06F 17/00* (2006.01)
(52) U.S. Cl.
USPC .............................................. 700/94; 381/103
(58) Field of Classification Search
None
See application file for complete search history.

(56) References Cited

U.S. PATENT DOCUMENTS

| | | | |
|---|---|---|---|
| 5,881,103 A * | 3/1999 | Wong et al. | 375/229 |
| 7,283,635 B1 * | 10/2007 | Anderson et al. | 381/74 |
| 2006/0198531 A1 * | 9/2006 | Berson | 381/61 |

\* cited by examiner

*Primary Examiner* — Andrew C Flanders
*Assistant Examiner* — David Siegel

(57) ABSTRACT

In some embodiments, techniques for audio processing may include receiving a first characterization of a first audio device, including a first audio parameterization that includes at least one parameter relating to characteristics of the first audio device; receiving a second characterization of a second audio device, including a second audio parameterization that includes at least one parameter relating to characteristics of the second audio device; determining a processing parameterization that includes a combination of a plurality of audio processing factors, wherein the audio processing factors include the first characterization and the second characterization; receiving a first electronic audio signal, as the input signal; generating a second electronic audio signal, as the output signal, wherein generating the second electronic audio signal includes processing the input signal using the processing parameterization; and providing the output signal via an electronic audio output interface.

20 Claims, 4 Drawing Sheets

SYNTHESIZED AUDIO PARAMETERS

CROSS REFERENCE TO RELATED APPLICATIONS

This application claims priority to U.S. Provisional Patent Application No. 61/226,744, entitled SYNTHESIZED AUDIO PARAMETERS, filed Jul. 19, 2009, which is incorporated herein by reference for all purposes.

FIELD OF THE INVENTION

The present invention relates generally to the area of audio processing. More specifically, techniques for combining audio parameters are disclosed.

BACKGROUND OF THE INVENTION

Audio devices, such as amplifiers, preamps, speakers, headphones, CD players, MP3 players, etc., each have various audio characteristics such as frequency response, soundstage characteristics, etc.

Audio encoded under various schemes and bit rates can have similar characteristics.

Users may have particular preferences for listening to audio content such as music, and preferences may vary both by user and also by genre, artist, album, track, movie, etc.

Current technologies do not allow for a holistic characterization of the audio processing characteristics of a user's stereo system and the ability to correspondingly compensate, nor do they permit per-user customization in a persistently stored, manageable fashion that is integrated with a characterization of the stereo system. Nor is there currently a way for users to share their characterization and tuning parameters with others.

Accordingly, it would be useful to be able to characterize multiple devices in a stereo system in combination, to characterize effects of audio encoding and decoding, and to allow for individual preferences based on various characteristics of content, and to compensate for one or more such criteria. It would also be useful to be able to share characterization and tuning parameters.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a non-transitory computer readable storage medium (such as a magnetic storage medium, e.g. a disk, an electronic storage medium, e.g. a flash memory, or an optical storage medium, e.g. a CD-ROM or DVD-ROM) or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
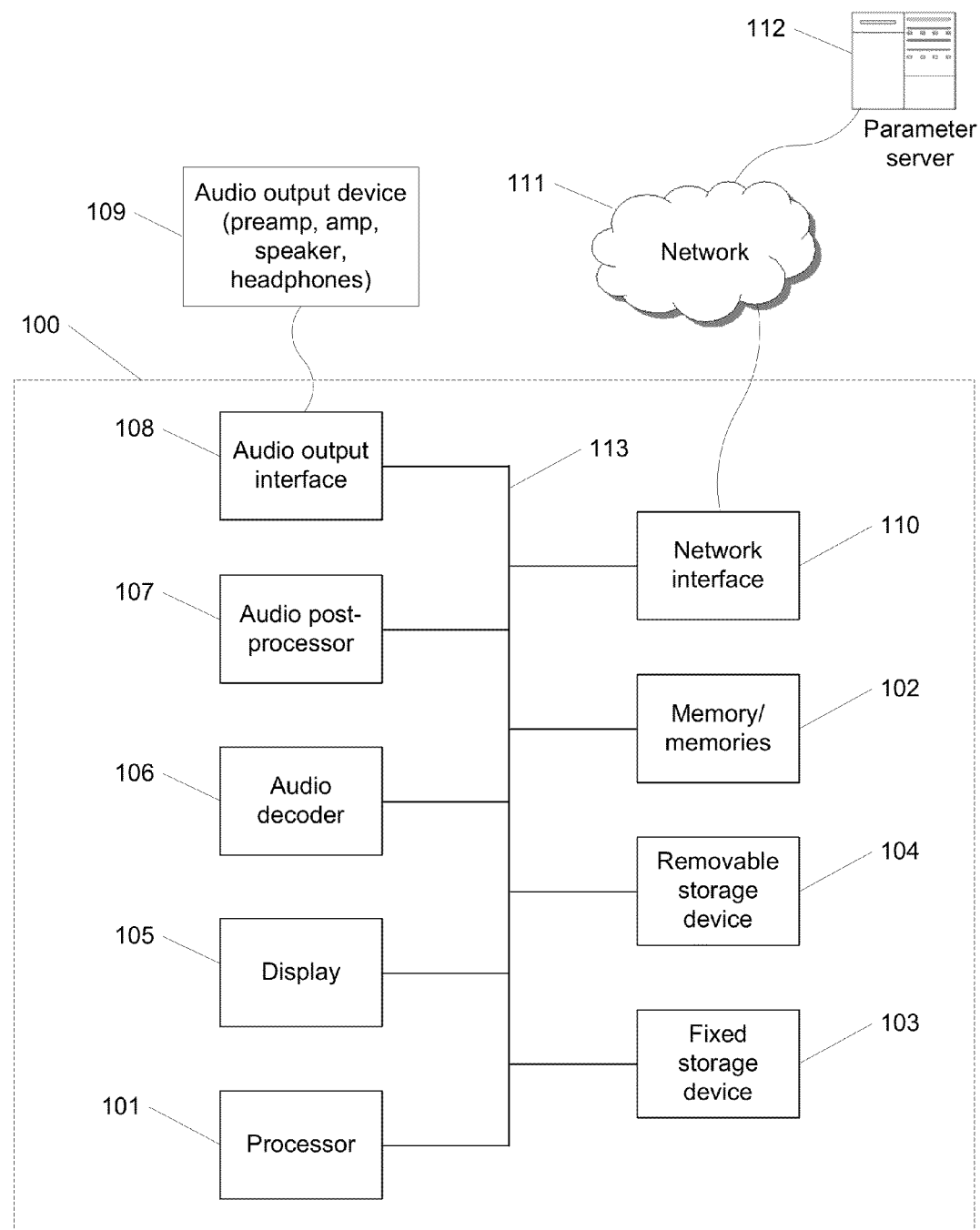
FIG. 1 is a functional diagram illustrating a programmed system for combining audio parameters, according to some embodiments.

FIG. 1 is a functional diagram illustrating a programmed system for combining audio parameters, according to some embodiments. As will be apparent, other computer system architectures and configurations can be used to combine audio parameters. In this example, audio playback device 100, which includes various subsystems as described below, includes at least one microprocessor subsystem (also referred to as a processor or a central processing unit (CPU)) 101. In various embodiments, processor 101 may be implemented by a single-chip processor or by multiple processors. In some embodiments, processor 101 is a general purpose digital processor that controls the operation of audio playback device 100. Using instructions retrieved from one or more memories 102, processor 101 controls the reception and manipulation of input data, and the output and display of data on output devices (e.g., display 105). In some embodiments, processor 101, alone or in combination with audio postprocessor 107, performs the client-side techniques described below in conjunction with the remaining Figures.

Processor 101 is coupled bi-directionally with a memory 102. Memory 102 may comprise multiple memories, and is referred to in the singular purely for expository simplicity. Memory 102 may include a first primary storage, typically a random access memory (RAM), and a second primary storage, typically a read-only memory (ROM). As is well known in the art, primary storage can be used as a general storage area and as scratch-pad memory, and can also be used to store input data and processed data. Primary storage can also store programming instructions and data, in the form of data objects and text objects, in addition to other data and instructions for processes operating on processor 101. Also as well known in the art, primary storage typically includes basic operating instructions, program code, data and objects used by the processor 101 and/or audio postprocessor 107 to perform their respective functions (e.g., programmed instructions). In some embodiments, primary memory 102 may include any suitable computer-readable storage media, described below, depending on whether, for example, data access needs to be bidirectional or unidirectional. In some embodiments, processor 101 and/or audio postprocessor 107 may also directly retrieve and store frequently needed data in one or more cache memories (not shown).

Fixed storage device 103 may provide data storage capacity for audio playback device 100, and is coupled either bidirectionally (read/write) or unidirectionally (read only) to processor 101. Examples of fixed storage device 103 include computer-readable media such as flash memory, a hard disk drive, an optical storage device such as a DVD-ROM, and other storage devices that retain their data when audio playback device 100 is powered off. Fixed storage device 103 may store additional programming instructions, data, and the like for processor 101, which may for example be loaded into memory 102 for use by processor 101 as needed. In some embodiments, a removable storage device 104, for example a flash memory card such as an SD card, a Micro SD card, or an SDHC card, provides additional data storage capacity. It will be appreciated that the information retained within storage devices 103, 104 can be incorporated, if needed, in standard fashion as part of memory 102 as virtual memory.

Display 105 may be any form of human-readable display, such as an LCD screen. Display 105 may display text and/or graphics as instructed by processor 101.

Audio decoder 106 may decode encoded audio, for example from fixed storage device 103 and/or memory 102. Such decoding commonly includes decompressing digital audio stored in a compressed format, such as MP3, AAC, WMA, aacPlus, Dolby Digital, Dolby Digital Plus, or Ogg Vorbis, into a decompressed digital bitstream. In some embodiments, audio decoder 106 may be a semiconductor device. In some embodiments, audio decoder 106 may be software running on processor 101 or audio postprocessor 107. In some embodiments, audio decoder 106 may be circuitry integrated onto another semiconductor device, such as processor 101 or audio postprocessor 107. In some embodiments, audio decoder 106 may be a programmable logic device, or a portion thereof.

Audio postprocessor 107 may perform digital manipulation on an audio bitstream, as described below. Such digital manipulation may in general be performed on audio data in the digital domain. In various embodiments, such an audio bitstream may be read from memory 102, or provided by audio decoder 106 or processor 101, or by an analog-to-digital converter (not shown) which converts analog audio to the digital domain. In some embodiments, audio postprocessor 107 may be a dedicated semiconductor device configured by predetermined parameters. In some embodiments, audio postprocessor 107 may be a programmable processor such as a digital signal processor (DSP) executing program instructions, such as an Analog Devices SHARC executing Sonic Focus software, available from ARC International.

Audio output interface 108 provides an interface to audio output device 109. Such an interface may include conversion of digital to analog. In some embodiments, audio output interface 108 may include amplification to a specified volume level. In some embodiments, audio output interface 108 provides a line-level electronic output. Audio output interface 108 may provide a physical interface to audio output device 109, such as an audio jack (for example a phono or mini jack), RCA plugs, USB, and/or speaker posts.

An example of an audio subsystem including audio decoder 106, audio postprocessor 107, and audio output interface 108, is the Portable Media Device Audio Solution, a product brief and specifications to which are available from ARC International, both of which are incorporated in their entirety by reference for all purposes.

Audio output device 109 converts a signal provided by audio output interface 108 from electrical signal to sound. Examples of audio output device 109 include a speaker and headphones. In some embodiments, audio output device may include other stereophonic components, such as a preamplifier and/or amplifier.

Network interface 110 is hardware that provides access to network 111. In some embodiments, such as for wired networks, network interface 110 may include a plug, such as an Ethernet plug. In some embodiments, such as for wireless networks, network interface 110 may include an antenna.

Network 111 may be any type of network, for example a public network such as the internet or a cellular phone network such as a GPRS network. In another example, the network 111 may be an enterprise or home network, a virtual private network, or a wireless network such as an 802.11 or Bluetooth network. In some embodiments, the network 111 may include more than one network. An example of a network 111 including more than one network is a local area network connected to a public network such as the internet. An example of the use of such a network is for an audio playback device 100 to be connected via a local area network such as an enterprise network (for example via a wireless router), and for the local area network to be connected to parameter server 112 via a public network such as the internet.

Parameter server 112 is connected, directly or indirectly, to the network 111. Parameter server 112 provides sets of parameters to audio playback device 100 via network 111. Such parameters may, in various embodiments, be provided as periodic downloads initiated by audio playback device 100, or pushed by parameter server 112. In some embodiments, parameter server 112 may be associated with a destination web site as described in conjunction with the remaining figures, and may provide content, such as web page(s) and/or other content associated with an online service, via the network 111. Such content may be provided to a personal computer (not shown) or an audio playback device 100.

Bus 113 may provide access between the various subsystems of audio playback device 100. Bus 113 is illustrative of any interconnection scheme serving to link the subsystems. Other computer architectures having different configurations of subsystems, and various other interconnection schemes, can also be utilized.

In various embodiments, audio playback system 100 may be a portable device such as an MP3 player, may be integrated into a cellular phone, may be a stereophonic component with wired connections to other stereophonic components, or may be a commodity personal computer running software for combining audio parameters.

The techniques of the remaining figures can be run on the system of this FIG. 1, as described above.

Figure 2:
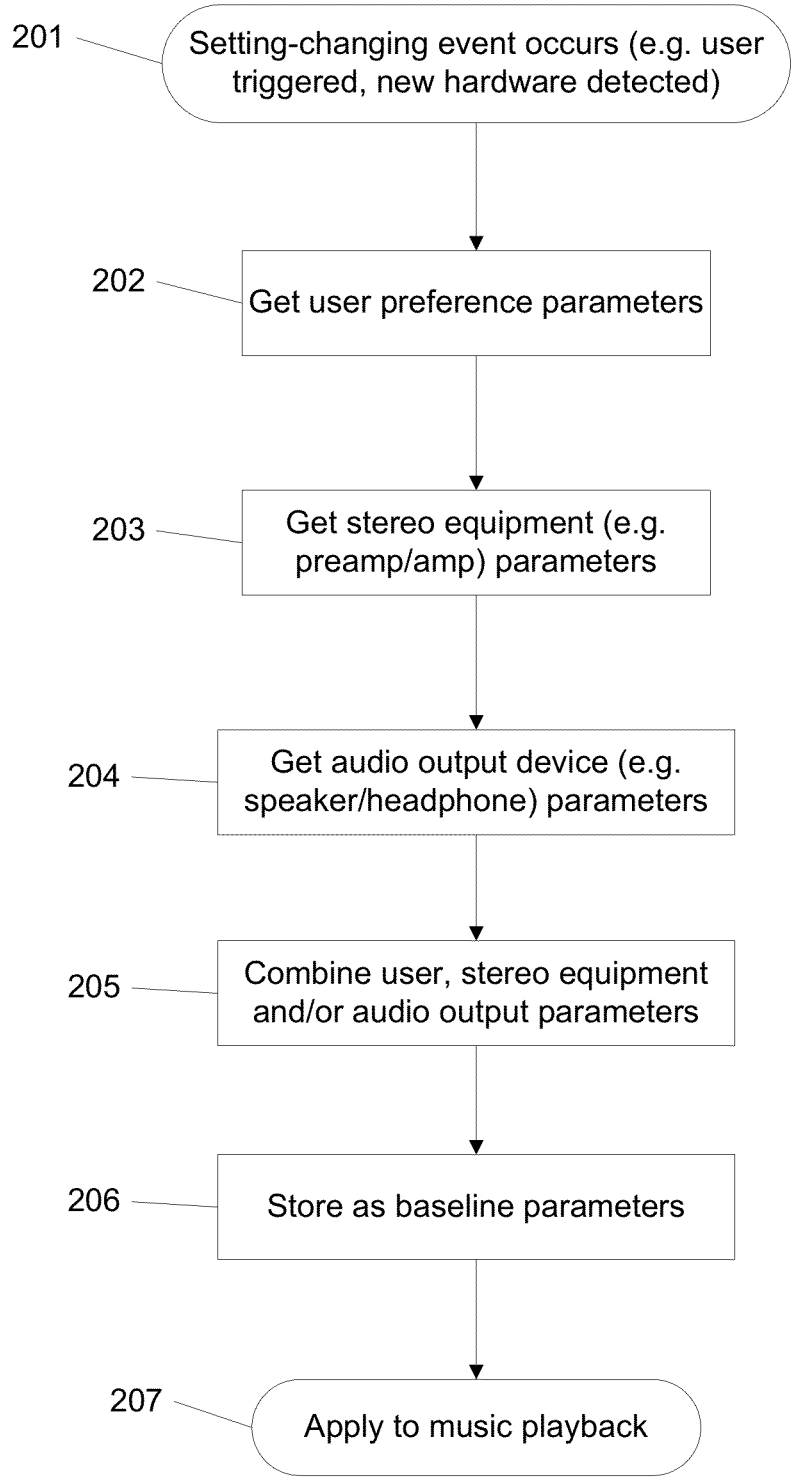
FIG. 2 is a flow diagram of a technique for obtaining baseline parameters, according to some embodiments.

FIG. 2 is a flow diagram of a technique for obtaining baseline parameters, according to some embodiments. Baseline parameters refer herein to audio playback parameters adapted to a particular hardware configuration, or a portion of a hardware configuration that is known and adapted to. In this example, a setting-changing event occurs and is detected (201). A setting-changing event may be any event that triggers a change in settings. Examples include a new installation of hardware or software for audio processing (such as the first time an audio playback device 100 of FIG. 1 is powered on, or any time an audio playback device 100 of FIG. 1 is powered on prior to configuration, or the first time after installation, or any time before configuration, that new audio processing software is executed), the detection of new hardware, such as a new speaker or headphones, and a user-initiated configuration, for example by running a configuration utility or by selecting a configuration user interface element. In some embodiments, detection of new hardware may be automatic, for example by automatic identification through plug-andplay over a USB interface, details of which will be readily understood by those skilled in the art.

In some embodiments, user preference parameters may be obtained (202). One example of obtaining user preference parameters is to retrieve them from storage. Another example of obtaining user preference parameters is to obtain them by inputs via user interface elements, for example sliders or numeric input fields on a display, which a user may manipulate via an input device such as a mouse or a touch screen.

Audio parameters such as user preference parameters may include any parameters that can be interpreted by audio post-processor 107 of FIG. 1. One example of parameters is a set of some number of controls at particular center frequencies, which may for example be specified as amplification gain in decibels, applied as an equalizer in a manner such as a graphic equalizer. In some embodiments, such equalization parameters may be spaced such that the center frequency of each filter is spaced a fixed fraction of an octave, such as one third of an octave, away from its neighbors. For example, equalization parameters for a 31-band equalizer with center frequencies spaced at one third of an octave apart could have center frequencies of 20 Hz, 25 Hz, 31.5 Hz, 40 Hz, 50 Hz, 63 Hz, 80 Hz, 100 Hz, 125 Hz, 160 Hz, 200 Hz, 250 Hz, 315 Hz, 400 Hz, 500 Hz, 630 Hz, 800 Hz, 1 kHz, 1.25 kHz, 1.5 kHz, 2 kHz, 2.5 kHz, 3.15 kHz, 4 kHz, 5 kHz, 6.3 kHz, 8 kHz, 10 kHz, 12.5 kHz, 16 kHz, and 20 kHz. Details of such equalization parameters are known to those skilled in the art, and may include the use of Butterworth roll-off filters with some fixed roll-off, such as 18 dB/octave. Another example of parameters is parameters that are inputs to a head-related transfer function (HRTF), details of which are known to those skilled in the art, parameters relating to the subjective dimensions of a soundfield, etc.

In some embodiments, user preference parameters may be or include parameters specific to a listening room. In some embodiments, such parameters may be deduced from one or more microphones which relay signals while a known audio source (such as a reference audio source, or audio that is known and characterized, and is detected or specified by a user) is played through the stereo system. In some embodiments, such listening room parameters may constitute a separate set of parameters that are combined as described herein.

In some embodiments, stereo equipment parameters may be obtained (203). Examples of stereo equipment parameters are parameters that pertain to audio device(s) which may be connected to other audio device(s). Examples of such audio devices include a preamplifier, an amplifier, a combination of preamplifier and amplifier (which combination may be created as described below, or which may be combined as other parameters are combined as described herein), a source component such as a CD player or a digital audio decoder (e.g. an MP3 or AAC decoder), and an audio playback device 100 of FIG. 1. Such audio devices may be the specific audio devices present in a user's stereo system, or similar to the specific audio devices present in a user's stereo system. In various embodiments, such parameters may be retrieved from storage, or may be based on user selection of the components that are connected, and/or may be obtained by autodetecting connected component(s) and retrieving related parameters from storage of via a network from a server.

Audio output device parameters may be obtained (204). Examples of audio output device parameters include parameters for speakers, and parameters for headphones. In various embodiments, such parameters may be user-selected, retrieved from storage, and/or over a network, as described above.

The various sets of parameters (user, listening room, stereo equipment, and/or audio output device parameters), which may be respectively referred to herein as "factors," may be combined (205). Combination of each parameter may be done in a manner appropriate to that parameter. For example, some parameters may appropriately be added together, for example a parameter specifying amplification gain of sound level in a logarithmic scale such as decibels. As another example, some parameters may appropriately be multiplied, such as a parameter specifying amplification gain in a linear scale, such as a specification that a factor of 5% increase be applied and another specifying that a factor of 10% increase be applied (in this example, 1 would be added to each factor and then subtracted from the product, i.e. 1.05 multiplied by 1.1 is 1.155, minus 1 is 0.155, or 15.5%). In some embodiments, each parameter may have a minimum and/or maximum value, which may be applied after combination to ensure that the value of the parameter is within the allowed range. For example, if the value is less than the minimum, or greater than the maximum, it may be set to the minimum or maximum respectively. In some embodiments, certain parameters may be combined in a non-linear manner, for example by applying a percentage as a percentage of the distance to the maximum or minimum rather than a percentage of the value of the parameter.

The resulting set of combined parameters may be stored as baseline parameters (206).

The baseline parameter may be used for music playback (207), for example as discussed below, which may for example include outputting an audio signal via audio output interface 108 of FIG. 1.

Figure 3:
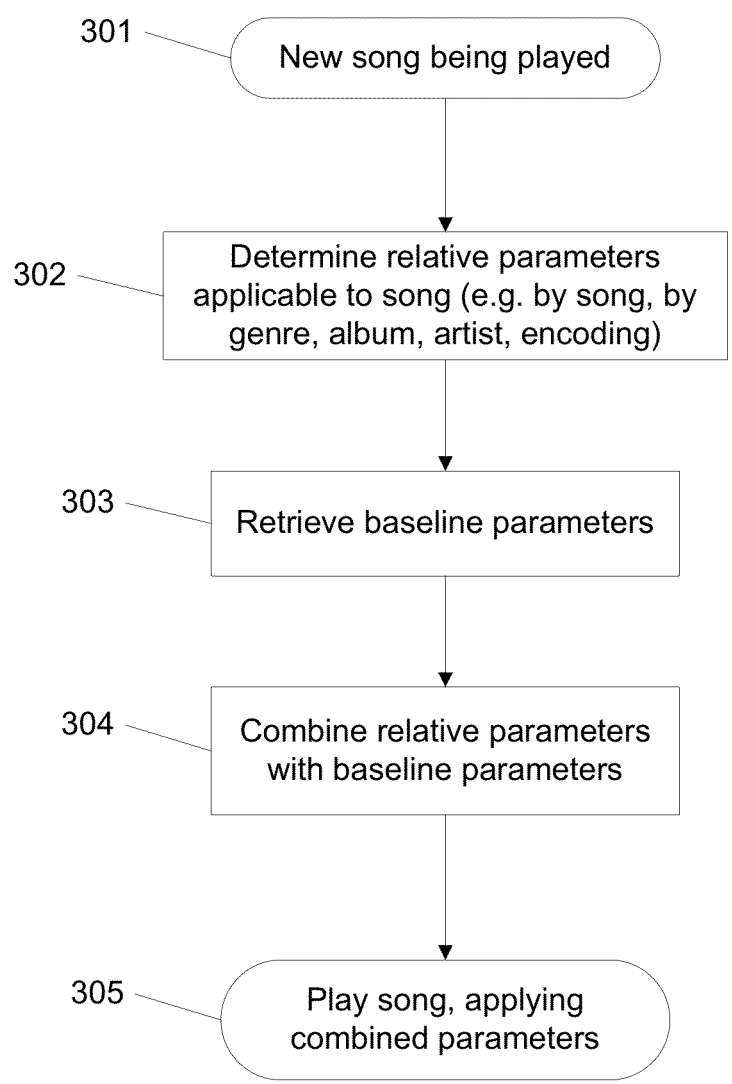
FIG. 3 is a flow diagram of a method for creating a set of parameters for playback of a song, according to some embodiments.

FIG. 3 is a flow diagram of a method for creating a set of parameters for playback of a song, according to some embodiments. In this example, a new song is to be played (301), for example because it is next on a playlist, or because it has been selected by a user or at random using a "shuffle" feature.

Relative parameters associated with the song may be determined (302). Examples of parameters are discussed above. In various embodiments, baseline parameters may be associated with the specific song to be played, with a genre associated with the song (which may for example be retrieved over a network or from local storage, keyed by the song, album and/or artist), with an album containing the song, with an artist associated with the song (which in some embodiments may be originated by an artist associated with the song, such as an artist performing the song, or a producer of the song), with information relating to a video source such as a movie, and/or with details of the audio encoding scheme that was used, such as the bit rate, compression scheme, and/or sample rate of the encoding. In some embodiments, multiple such sets of parameters may be obtained for two or more of these criteria (such as for the audio encoding and for the song, album, genre, or artist), and combined as described below; for expository purposes, this will be discussed without loss of generality as if it was a single set of parameters.

Baseline parameters may be retrieved (303), such as those generated as discussed in conjunction with FIG. 2, for example from storage.

Relative parameters associated with the song may be combined with baseline parameters (304), for example as discussed in conjunction with 205 of FIG. 2, to yield customized song parameters.

The song may be played using such customized song parameters (305).

Figure 4:
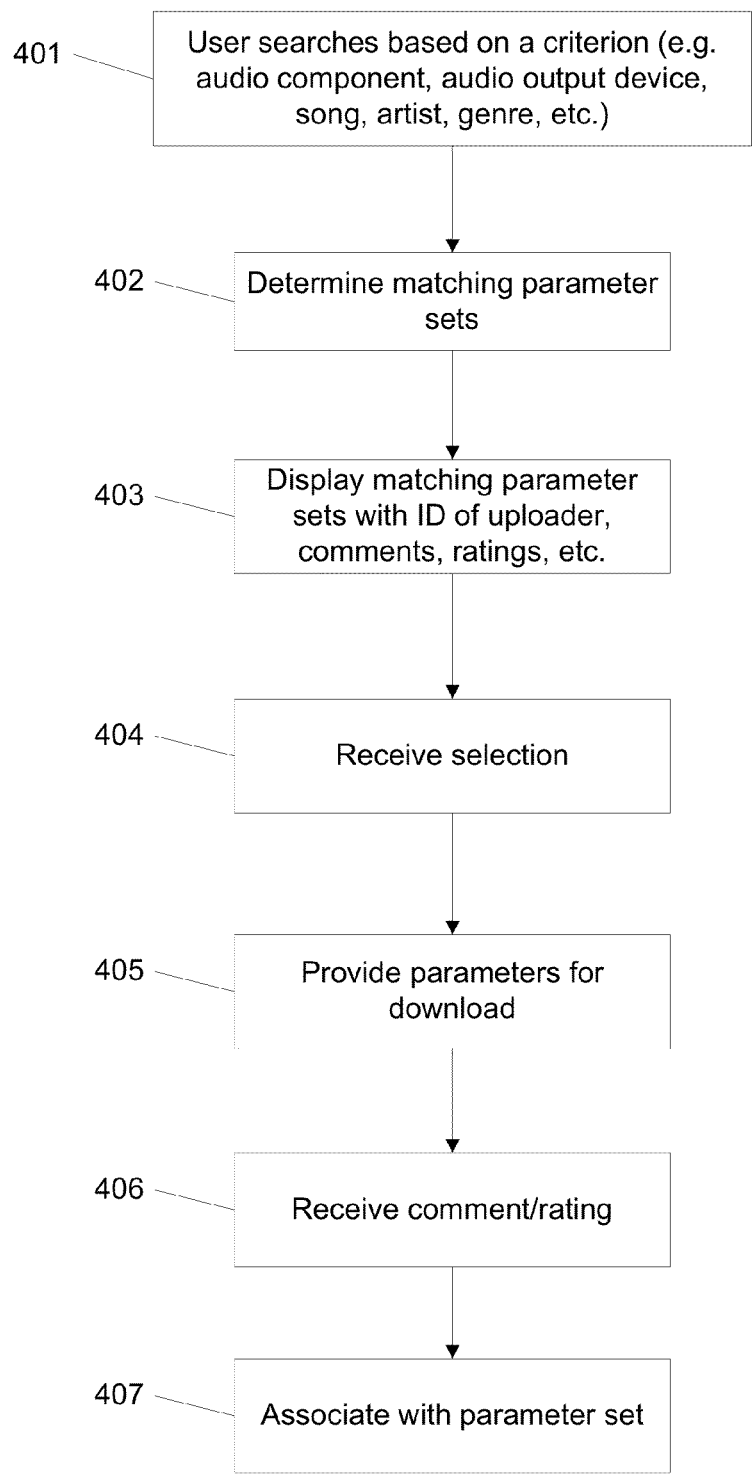
FIG. 4 is a flow diagram of a method for retrieving parameters from an online service, according to some embodiments.

FIG. 4 is a flow diagram of a method for retrieving parameters from an online service, according to some embodiments. In this example, a user searches based on a criterion (401). Examples of criteria include a song title, lyrics, a genre, artist, album, an audio component such as an amplifier or preamplifier, and an audio output device such as a speaker or headphones. In some embodiments, a search may be a keyword search, e.g. by words in a title etc. or a manufacturer or model number associated with an audio component or output device. In some embodiments, a search may be by browsing, by category, rating, popularity, or any other information architecture known to those skilled in the art. A search may be done on an audio playback device, for example using application software that provides its own user interface and communicates with an online service, or on an online service accessed via a web browser running on the audio playback device, or on a personal computer that synchronizes with the audio playback device. In various embodiments, a search may be done by communicating directly against an online service, or by searching against local content (e.g. cached or downloaded content) that may be updated from the online service, e.g. on demand, periodically, or by explicit user action.

One or more matching parameter sets may be determined (402), for example by displaying parameter sets corresponding to a browsing directive, or matching a query such as a search query (for example fulfilled via a relational database, and/or an inverted index providing one or more matches for a query). Such parameter sets may be provided by a record label or a component manufacturer, or may be user-contributed. In some embodiments, a query may be refined by a user specifying a category of parameter sets that are of interest, such as vendor-provided or user-contributed. In some embodiments, such user-contributed parameter sets may be the result of modification of an existing parameter set, which may for example be enabled via a user interface permitting such modification, and uploading via an electronic network such as the internet.

The matching parameter set(s) may be displayed (403). In some embodiments, each such parameter set may have metadata associated with it, which may also be displayed. Examples of such metadata include a name of a contributor who contributed the parameter set, an indication of a category to which that contributor belongs (such as vendor or end-user), an indication of the reputation of the contributor (for example based on the number of contributions the contributor has made, the length of time the contributor has been a member of the service providing the parameter sets, and/or the ratings that contributor's contributions have garnered), comments left by users about the parameter sets, and/or ratings left by users about the parameter sets.

A selection of a particular parameter set may be received (404) from among the candidate parameter sets as described above, for example via selection of a user interface element such as a checkbox, radio button, and/or selection button.

In some embodiments, such as those embodiments involving a web service, a parameter set corresponding to the selection may be provided for download (405), for example over a network via TCP/IP. A client device may download the parameter set and store them associated with the criterion, such as a song, genre, artist, audio component or output device, etc., for example in a database in persistent storage, keyed by the criterion. Such storage and association may be done directly by the audio playback device, or using a personal computer as an intermediary and synchronizing from the personal computer to an audio playback device. Such parameters may subsequently be used as discussed in conjunction with FIGS. 2 and 3.

In some embodiments, a comment and/or rating associated with the parameter set may be received (406) and associated with the parameter set (407) and/or used in calculating a reputation associated with the contributor of the parameter set, as described above.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for audio processing, comprising:
   receiving an amplification characterization, wherein the amplification characterization characterizes a first audio device, wherein the first audio device is at least one of a preamplifier and an amplifier, and wherein the amplification characterization includes a an amplification audio parameterization, wherein the amplification audio parameterization includes at least one parameter relating to characteristics of the first audio device;
   receiving an output characterization, wherein the output characterization characterizes a second audio device, wherein the second audio device is at least one of headphones and a speaker, and wherein the output characterization includes an output audio parameterization, wherein the output audio parameterization includes at least one parameter relating to characteristics of the second audio device;
   receiving a user-defined audio parameterization, wherein the user-defined audio parameterization includes equalization parameters relating to output adjustments at each of a plurality of center frequencies, wherein the equalization parameters were received by manipulation by a user of a plurality of sliders on a display, wherein each of the plurality of sliders corresponds to a center frequency;
   determining a processing parameterization, wherein the processing parameterization includes a combination of a plurality of audio processing factors, wherein the audio processing factors include the amplification audio parameterization, the output audio parameterization, and the user-defined audio parameterization;
   receiving a first electronic audio signal, as the input signal;
   generating a second electronic audio signal, as the output signal, wherein generating the second electronic audio signal includes processing the input signal using the processing parameterization; and
   providing the output signal via an electronic audio output interface.

2. The method of claim 1, wherein the audio processing factors include a fourth parameterization.

3. The method of claim 2, wherein the fourth parameterization relates to a user preference.

4. The method of claim 2, wherein the fourth parameterization relates to a musical genre.

5. The method of claim 2, wherein the fourth parameterization relates to a musical album.

6. The method of claim 2, wherein the fourth parameterization relates to a musical track.

7. The method of claim 2, wherein the fourth parameterization relates to a digital audio encoding scheme.

8. The method of claim 1, further comprising downloading a parameterization, as the downloaded parameterization, and wherein the audio processing factors include the downloaded parameterization.

9. The method of claim 8, wherein the downloaded parameterization is selected from amongst a plurality of user-contributed parameterizations, wherein the user-contributed parameterizations are contributed by a plurality of users.

10. The method of claim 8, wherein the downloaded parameterization is the amplification parameterization.

11. The method of claim 8, wherein the downloaded parameterization is the output parameterization.

12. The method of claim 1, wherein first audio device is a preamplifier.

13. The method of claim 1, wherein first audio device is an amplifier.

14. The method of claim 1, wherein the second audio device is a speaker.

15. The method of claim 1, wherein the second audio device is a headphone.

16. The method of claim 8, further comprising:
presenting a user interface, wherein the user interface includes a plurality of candidate parameterizations, wherein the plurality of parameterizations includes the downloaded parameterization; and
receiving a selection of the downloaded parameterization via the user interface.

17. The method of claim 8, further comprising:
presenting a user interface, wherein the user interface includes a search field;
receiving a user input associated with the search field; and
presenting one or more candidate parameterizations, wherein the one or more candidate parameterizations includes the downloaded parameterization.

18. The method of claim 1, further comprising:
enabling modification of the first characterization; and
providing the first characterization to an online service via an electronic network.

19. A system for audio processing, comprising:
a processor configured to:
receive an amplification characterization, wherein the amplification characterization characterizes a first audio device, wherein the first audio device is at least one of a preamplifier and an amplifier, and wherein the amplification characterization includes a an amplification audio parameterization, wherein the amplification audio parameterization includes at least one parameter relating to characteristics of the first audio device;
receive an output characterization, wherein the output characterization characterizes a second audio device, wherein the second audio device is at least one of headphones and a speaker, and wherein the output characterization includes an output audio parameterization, wherein the output audio parameterization includes at least one parameter relating to characteristics of the second audio device;
receive a user-defined audio parameterization, wherein the user-defined audio parameterization includes equalization parameters relating to output adjustments at each of a plurality of center frequencies, wherein the equalization parameters were received by manipulation by a user of a plurality of sliders on a display, wherein each of the plurality of sliders corresponds to a center frequency;
determine a processing parameterization, wherein the processing parameterization includes a combination of a plurality of audio processing factors, wherein the audio processing factors include the amplification audio parameterization, the output audio parameterization, and the user-defined audio parameterization;
receive a first electronic audio signal, as the input signal;
generate a second electronic audio signal, as the output signal, wherein generating the second electronic audio signal includes processing the input signal using the processing parameterization; and
provide the output signal via an electronic audio output interface; and
a memory coupled with the processor, wherein the memory provides instructions to the processor.

20. A computer program product for audio processing, the computer program product being embodied in a computer readable storage medium and comprising computer instructions for:
receiving an amplification characterization, wherein the amplification characterization characterizes a first audio device, wherein the first audio device is at least one of a preamplifier and an amplifier, and wherein the amplification characterization includes a an amplification audio parameterization, wherein the amplification audio parameterization includes at least one parameter relating to characteristics of the first audio device;
receiving an output characterization, wherein the output characterization characterizes a second audio device, wherein the second audio device is at least one of headphones and a speaker, and wherein the output characterization includes an output audio parameterization, wherein the output audio parameterization includes at least one parameter relating to characteristics of the second audio device;
receiving a user-defined audio parameterization, wherein the user-defined audio parameterization includes equalization parameters relating to output adjustments at each of a plurality of center frequencies, wherein the equalization parameters were received by manipulation by a user of a plurality of sliders on a display, wherein each of the plurality of sliders corresponds to a center frequency;
determining a processing parameterization, wherein the processing parameterization includes a combination of a plurality of audio processing factors, wherein the audio processing factors include the amplification audio parameterization, the output audio parameterization, and the user-defined audio parameterization;
receiving a first electronic audio signal, as the input signal;
generating a second electronic audio signal, as the output signal, wherein generating the second electronic audio signal includes processing the input signal using the processing parameterization; and
providing the output signal via an electronic audio output interface.

* * * * *